United States Patent
Peschke et al.

(10) Patent No.: US 9,310,455 B2
(45) Date of Patent: Apr. 12, 2016

(54) PROBE SYSTEM WITH COMPENSATING NETWORK

(75) Inventors: Martin Peschke, Munich (DE); Cédric Bonnet, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 272 days.

(21) Appl. No.: 13/579,901

(22) PCT Filed: Jan. 12, 2011

(86) PCT No.: PCT/EP2011/000102
§ 371 (c)(1),
(2), (4) Date: Oct. 4, 2012

(87) PCT Pub. No.: WO2011/101071
PCT Pub. Date: Aug. 25, 2011

(65) Prior Publication Data
US 2013/0207643 A1    Aug. 15, 2013

(30) Foreign Application Priority Data

Feb. 19, 2010  (DE) .......... 10 2010 008 621
Mar. 4, 2010   (DE) .......... 10 2010 010 100
Aug. 26, 2010  (DE) .......... 10 2010 035 456

(51) Int. Cl.
*G01R 35/00* (2006.01)
*G01R 1/067* (2006.01)

(52) U.S. Cl.
CPC .......... *G01R 35/005* (2013.01); *G01R 1/06766* (2013.01); *G01R 1/06788* (2013.01)

(58) Field of Classification Search
CPC ........... G01R 1/06766; G01R 1/06772; G01R 29/02; G01R 17/02; G01R 19/10; G01R 1/06788; G01R 1/073; G01R 1/07307; G01R 1/24; G01R 27/02; G01R 27/28; G01R 31/316; G01R 35/005
USPC ........ 324/72.5, 130, 149, 601, 619, 620, 690, 324/715, 724, 126, 158.1
See application file for complete search history.

(56) References Cited

U.S. PATENT DOCUMENTS 4,743,839 A    5/1988  Rush
6,483,284 B1   11/2002 Eskeldson
(Continued)

FOREIGN PATENT DOCUMENTS

EP    1 605 588 A2    12/2005

OTHER PUBLICATIONS

Bonekamp, H., "Differential Probe," Elektor Electronics 20(228):98, Dec. 1994.
(Continued)

*Primary Examiner* — Arleen M Vazquez
*Assistant Examiner* — Lee Rodak
(74) *Attorney, Agent, or Firm* — Christensen O'Connor Johnson Kindness PLLC

(57) ABSTRACT

A probe system for registering a differential input signal has a first input network, which is supplied with a first component of the differential input signal in order to generate a first intermediate signal, and a second input network which is supplied with a second component of the differential input signal in order to generate a second intermediate signal. A differential amplifier for the amplification of the difference between the intermediate signals is arranged in the signal flow direction downstream of the input networks. At least one compensation network is used to compensate the influence of the input networks and is arranged at the output end of the differential amplifier or in a feedback path connecting an output to an input of the differential amplifier.

6 Claims, 2 Drawing Sheets

(56) References Cited

U.S. PATENT DOCUMENTS

| | | | |
|---|---|---|---|
| 6,822,463 | B1 | 11/2004 | Jacobs |
| 6,856,126 | B2 | 2/2005 | McTigue |
| 2004/0075502 | A1* | 4/2004 | Hogervorst ............... 330/292 |
| 2006/0061348 | A1 | 3/2006 | Cannon |
| 2007/0164731 | A1* | 7/2007 | Pollock et al. ........... 324/158.1 |

OTHER PUBLICATIONS

Haga, K., and K. Chujo, "High-Frequency Active Probe for Oscilloscope With Optimum Design for the SICE-ICASE International Joint Conference 2006 (SICE-ICCAS 2006)," Bexco, Busan, Korea, Oct. 18-21, 2006, pp. 5264-5267.

International Search Report mailed Apr. 14, 2011, issued in corresponding International Application No. PCT/EP2011/000102, filed Jan. 12, 2011, 3 pages.

"Z-Active™: A New High Performance Probe Architecture," Technical Brief, Tektronix, Inc., Oct. 2004, 24 pages.

International Preliminary Report on Patentability mailed Sep. 5, 2012, issued in corresponding International Application No. PCT/EP2011/000102, filed Jan. 12, 2011, 10 pages.

\* cited by examiner

PROBE SYSTEM WITH COMPENSATING NETWORK

The invention relates to a probe system, for example, for an oscilloscope. However, the probe system can also be used for other measuring instruments, for example, a spectrum analyser or a network analyser.

Various probe systems with different amplifier architectures are already known from the prior art. For example, U.S. Pat. No. 6,856,126 B2 discloses an amplifier architecture with a differential probe with two bipolar buffer units operated in a common-base circuit and a differential amplifier. In this context, compensation networks which are supposed to compensate the zero of the peak network are present.

Accordingly, the invention is based upon the object of providing a probe system with an improved common-mode suppression, which acts as homogeneously as possible over the entire frequency range.

The object is achieved by the features of claim 1. The independent claims specify advantageous further developments of the inventions.

According to the invention, at least one compensation network is arranged at the output end of the differential amplifier or in a feedback path connecting an output to the input of the differential amplifier. By contrast with the input-end arrangement of the compensation network known from the prior art, this has the advantage of providing a substantially improved common-mode suppression. While in the case of the prior art, the two input currents are supplied to the compensation networks individually referenced to the ground and independently from one another, and the difference formation is implemented only after this at the voltage level, in the case of the invention, the difference between the input currents is formed first, and only then is the difference between the input currents supplied to the at least one compensation network at the output end of the amplifier. While in the case of the prior art, the common-mode currents are routed directly to the differential amplifier as a common-mode modulation, in the case of the invention, the common-mode input signals are already suppressed before they are supplied to the compensation network. As a result, the sensitivity with regard to common-mode noise is also strongly reduced.

While in the case of the prior art, even small differences between the two input-end compensation networks, such as occur, for example, through manufacturing tolerances, immediately lead to a conversion of common-mode voltages into differential voltages, this effect is strongly reduced with the embodiment according to the invention, because the compensation takes place after the difference formation, and only one compensation network is relevant. Accordingly, no problems with tolerances, as in the case of two independent compensation networks, can occur. Moreover, it has been shown that a difference formation of currents is possible with a high linearity over a broad bandwidth.

The embodiment of the input network with two resistors, wherein only one of the resistors is bridged by a parallel-connected capacitor, has the advantage that a pole is also present in the input network in addition to a zero. In the case of the prior art, by contrast, only a zero is present, because the series resistor is missing. As a result of the pole, the input impedance at high frequencies is raised in the range of several GHz.

However, with a corresponding embodiment of the compensation network with two series resistors and a capacitor connected in parallel to one of the two series resistors, a mutual compensation is achieved with an appropriate dimensioning. In this context, the pole of the compensation network compensates the zero of the input network, and the zero of the compensation network compensates the pole of the input network. In general, it is sufficient to provide only a single compensation network at the output, preferably at the output, at which the signal to be further processed is picked up. If the amplifier is embodied as a fully differentiating amplifier with a differential output, it can be advantageous for the improvement of symmetry, also to provide a second compensation network at the second inverted output. Alternatively, it is also possible to arrange the compensation network directly between the two outputs instead of between each output and the circuit ground, wherein at least two series resistors are then advantageously provided, and the capacitor is arranged parallel to one of the resistors.

As an alternative, it is also possible to arrange the compensation network in a feedback path between the output and the allocated input instead of arranging the compensation network between the output and the circuit ground.

By way of example, the invention is explained in greater detail below with reference to the exemplary embodiments presented in the drawings. The drawings are as follows:

FIG. 1 shows a first exemplary embodiment of the probe system according to the invention. The probe system according to the invention is used especially as a probe for an oscilloscope; however, it can also be used in other ways.

Figure 1:
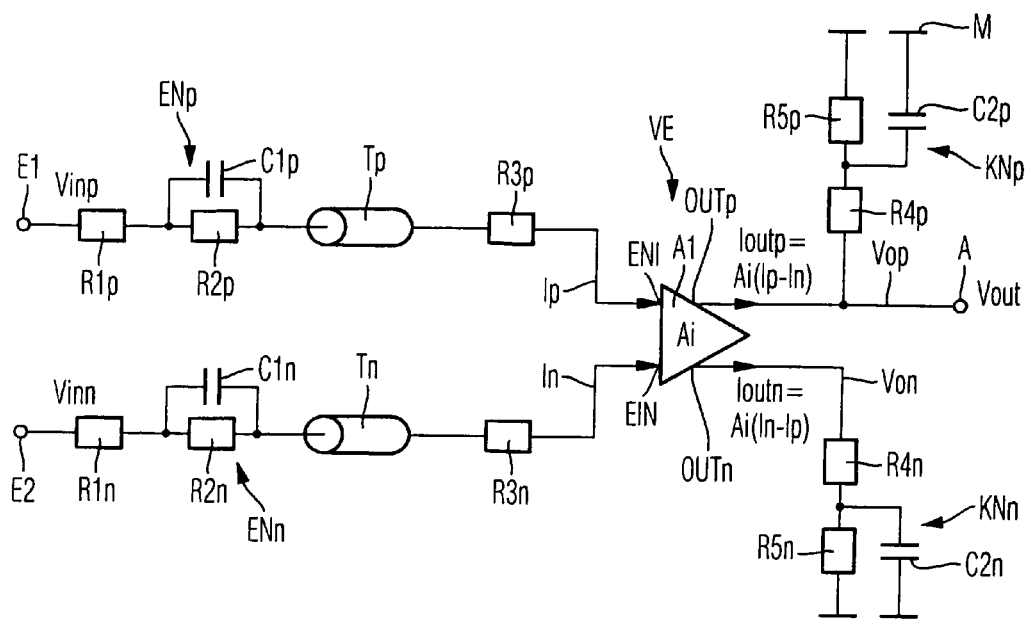
FIG. 1 shows a basic circuit diagram of a first exemplary embodiment of the probe system according to the invention.

The voltage Vinp of an input signal is supplied to an input terminal E1. In the exemplary embodiment, this input signal Vinp initially passes through a first resistor R1$p$ and a second resistor R2$p$ before it reaches a transmission line Tp. This transmission line Tp can be, for example, a coaxial line. However, flat strip conductors or striplines, especially coplanar lines are also possible. By means of the transmission line Tp, the signal is transported over a given spatial distance to an amplification unit VE.

In the amplifier unit VE, the input signal then travels via a third resistor R3$p$ to the input ENI of a differential amplifier A1. The input resistance of this amplifier A1 is preferably designed to be low-ohmic, so that a significant current IP flows into the input of the amplifier A1. The amplifier A1 is preferably designed as a differential current amplifier, that is to say, its output current Ioutn or Ioutp is proportional to the difference between the input currents Ip, In.

The second resistor R2$p$ in the preferred exemplary embodiment is bridged by a first capacitor C1$p$ by connecting this capacitor C1$p$ in parallel to the resistor R2$p$. Accordingly, the resistor R2$p$ is bridged and not active for the high-frequency signal portions of the input signal Vinp, that is, for the high-frequency signal components. The resistors R1$p$ and R2$p$ together with the capacitor form an input network ENp.

A first compensation network KNp, comprising a fourth resistor R4$p$, a fifth resistor R5$p$ and a second capacitor C2$p$, is connected to the first output OUTp of the first amplifier A1. In the exemplary embodiment, the compensation network KNp is embodied as a parallel circuit of the resistor R5$p$ with the capacitor C2$p$ and arranged between the first output terminal OUTp of the amplifier A1 and the circuit ground M. With the prior art of U.S. Pat. No. 6,856,126 B2, by contrast, only one compensation network is relevant for the function of the circuit. This has substantial advantages. In particular, unavoidable manufacturing tolerances between the compensation networks KNp, KNn do not lead to a conversion of common-mode signals into differential signals. The CMM (Common Mode Response Ratio, behaviour under common-mode control) is substantially improved in the embodiment according to the invention.

The probe system is conceived for differential input signals, that is to say, the output voltage Vout at the output A is dependent upon the voltage difference between the first input terminal E1 and a second input terminal E2 or respectively the current difference Ip−In between the inputs ENI and EIP of the amplifier A1. Parallel with the first signal path for the positive input signal Vinp, there is a second signal branch for the negative input signal Vinn, which is connected to the second input terminal E2. This negative input signal Vinn travels via a corresponding first resistor R1n and a second resistor R2n to the input terminal of a second transmission line Tn. The second resistor R2N is also bridged here with the corresponding first capacitor C1n. From the output of the transmission line Tn, the signal travels via a third resistor R3n to the inverting input EIN of the amplifier A1, which is embodied as a fully differential amplifier.

The amplifier A here is a current amplifier. The output current Ioutp at the first output OUTp is dependent via the amplification factor A1 upon the difference between the currents Ip and In at the input. The following equation applies: Ioutp=Ai*(Ip−In). Conversely, the following applies for the current Ioutn Von at the second output OUTn: IOutn=Ai*(In−Ip). A compensation network KNn, which comprises a parallel circuit of a fifth resistor R5n and a second capacitor C2n with a fourth resistor R4n connected in series to the latter and which connects the second inverting output OUTn of the amplifier A1 to the circuit ground M can also be present in the second signal branch. The second compensation network KNn is not absolutely necessary and can also be provided instead of the first compensation network KNp. In every case, small differences between KNp and KNn do not play a part and do not lead to an output signal Vout with common-mode modulation (Vinp−Vinn).

Figure 2:
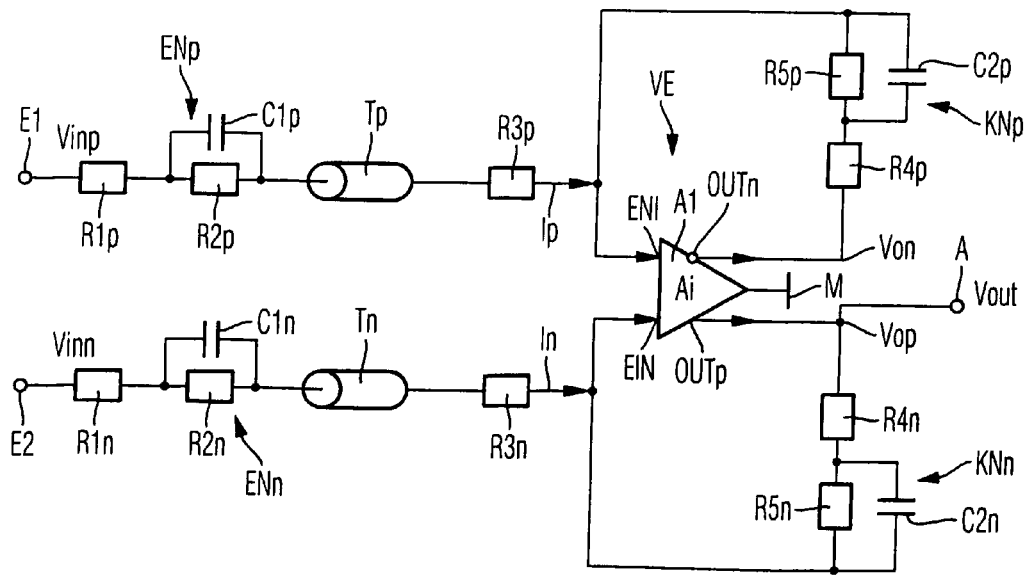
FIG. 2 shows a basic circuit diagram of a second exemplary embodiment of the probe system according to the invention.

FIG. 2 shows a second exemplary embodiment of the probe system according to the invention. Circuit elements already described with reference to FIG. 1 have been marked with corresponding reference numbers and will not be described again in order to avoid repetition. The following description focuses only on the peculiarities of the second exemplary embodiment.

In the illustrated second exemplary embodiment, the amplifier A2 is embodied as a fully differential operational amplifier. By contrast with the first exemplary embodiment illustrated in FIG. 1, the compensation network KNp and respectively KNn in the second exemplary embodiment illustrated in FIG. 2 is not embodied between the output OUTp and respectively OUTn and the circuit ground M, but between the inverted output OUTn of the fully differential operational amplifier A2 and an non-inverting input ENI of the amplifier A2 or respectively between the non-inverted output OUTp and the inverting input EIN.

In the exemplary embodiment illustrated in FIG. 2, the compensation network KNp is also embodied as a parallel circuit of a fifth resistor R5p and a second capacitor C2p in combination with a fourth resistor R4p connected in series to this parallel circuit. This latter circuit connects the output OUTn of the amplifier A2 to a non-inverting input ENI. The compensation network KNn, which connects the output OUTp of the amplifier A2 to its inverting input EIN is embodied in a similar manner. The circuit illustrated in FIG. 2 is substantially functionally equivalent to the circuit illustrated in FIG. 1.

The resistors R1, R2 and the capacitor C1 each generate a zero and a first pole in the frequency response. Typical values are disposed at R2n=R2p=50 kOhm. A preferred value range is disposed between 5 kOhm and 100 kOhm. A typical value for R1p=R1n is disposed at 450 Ohms. A reasonable value range is disposed between 50 Ohms and 1 kOhm. A typical value for the first capacitor is disposed at C1p=C1n=0.2 pF. A preferred value range is disposed between 0.1 pF and 1 pF. A typical value for the third resistor R3p=R3n is disposed at 50 Ohms. The preferred value range here is disposed between 10 Ohms and 100 Ohms. A typical value for the fourth resistor R4p=R4n is disposed, for example, at 5050 Ohms. A preferred value range is disposed between 1 kOhm and 10 kOhms. A typical value for the capacitance of the second capacitor C2p=C2n is disposed at 2 pF. A preferred value range for this is disposed between 0.5 pF and 5 pF.

The resistors R3p and R3n are used to terminate the transmission lines Tp and Tn correctly with regard to surge-impedance. So-called trans-impedance operational amplifiers can be used for the amplifier A1, which should provide a relatively low input impedance up to high-frequencies.

A second zero and a second pole in the frequency response is generated with the compensation networks KNn and KNp comprising the resistors R4p, R5p and R4n, R5n and the capacitors C2p and C2n, wherein the frequency of the second pole is equal to the frequency of the first zero, and the frequency of the second zero is equal to the frequency of the first pole.

The transmission lines Tp and Tn are terminated correctly over the entire frequency range, so that no interfering waviness arises in the frequency response. The input resistance of the circuit with direct voltage corresponds to the sum of the resistances R1+R2+R3 and is therefore very high. The input network ENp and respectively ENn arranged at the input end of the transmission line Tp and respectively Tn in the proximity of the probe is very much smaller than the amplifier module VE and can very simply be arranged in positions with difficult access within a probe.

The value ranges and explanations named above apply not only to the exemplary embodiment of FIG. 2, but also to all exemplary embodiments.

Figure 3:
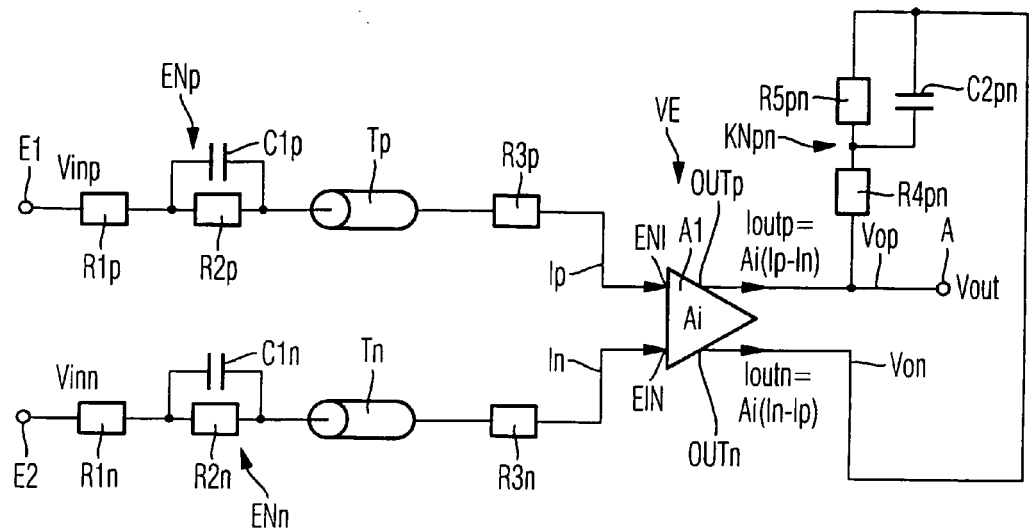
FIG. 3 shows a basic circuit diagram of a third exemplary embodiment of the probe system according to the invention.

FIG. 3 shows a further alternative exemplary embodiment. With this exemplary embodiment, by contrast with FIG. 1, a compensation network KNp is not provided respectively between the output OUTp and the circuit ground M and a second compensation network KNn between the output OUTn and the circuit ground M, but a common compensation network KNpn is present, which is arranged between the two outputs OUTp and OUTn. Because of the symmetry relative to the circuit ground, a connection to the circuit ground is not required. This compensation network KNpn expediently comprises two series-connected resistors R4pn, R5pn. The capacitor C2pn is then expediently connected in parallel to the resistor R5pn. In this exemplary embodiment, the output voltage Vout is the difference between the two output voltages Vop, Von: Vout=Vop−Von.

Figure 4:
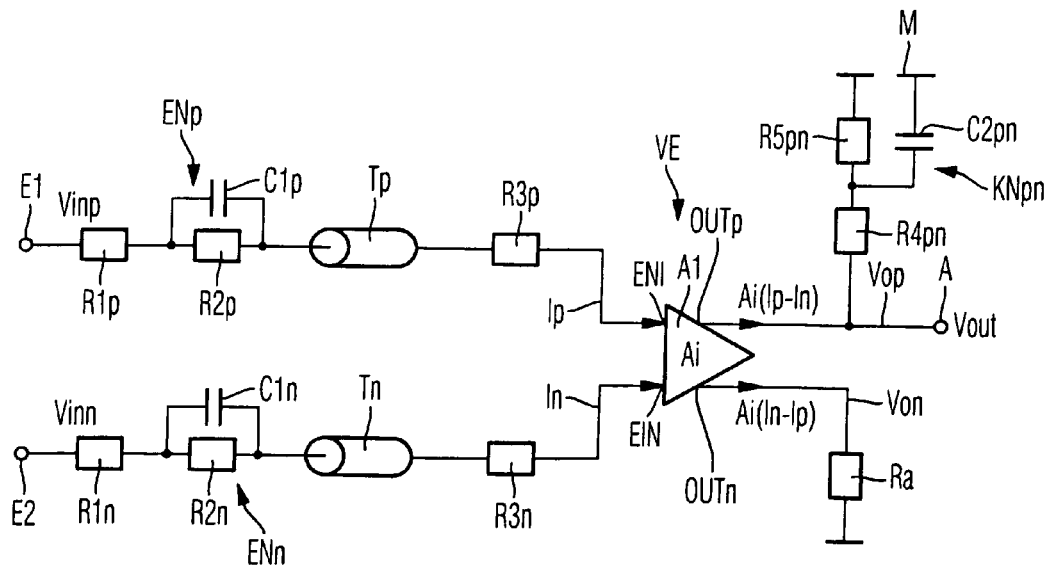
FIG. 4 shows a basic circuit diagram of a fourth exemplary embodiment of the probe system according to the invention.

FIG. 4 shows a fourth exemplary embodiment of the probe system according to the invention. This exemplary embodiment differs from the exemplary embodiment illustrated in FIG. 1 in that the second compensation network KNn at the output OUTn not used for the further processing of the signal is dispensed with. Instead, the output OUTn, from which the difference between the currents In−Ip multiplied by the amplification factor Ai flows, is terminated with a terminal resistor Ra. This terminal resistor Ra connects the output OUTn to the circuit ground M. In a similar manner, the exemplary embodiment illustrated in FIG. 2 could also be modified by omitting the second compensation network KNn here.

Accordingly, only a single compensation network KNp is sufficient, because it acts on the output current, which is dependent via the amplification factor Ai upon the difference Ip−In between both input currents Ip and also In. Accordingly, the compensation network KNp acts against both input networks ENp and ENn. It is even advantageous to use only a single compensation network KNp, on the one hand, in order to simplify the circuit and on the other hand, to avoid the effect of component tolerances on the precise position of the second zero and the second pole of the compensation networks. This is expediently arranged at the output OUTp, at which the output voltage Vout is picked up via the output terminal A. However, in principle, the single compensation network KNn could also be arranged at the other output OUTn, and the compensation network KNp can then be dispensed with.

The embodiment according to FIG. 4 can also be used if the differential amplifier A1 has only a single output, for example, only the output OUTp, of which the output current Ioutp is dependent only upon the difference between the currents Ip−In, but not the output OUTn, of which the output current Ioutn is dependent upon the difference between the currents In−Ip.

The output voltage Vout can also be further buffered in order to be supplied via a further waveguide to a measuring device. The voltages Vop and Von can also be supplied directly to a measuring device with differential input. To improve the residual waviness resulting from multiple reflections on the waveguide Tp and Tn further, the waveguides Tp and Tn can also be terminated with a resistor in the order of magnitude of the resistance values of the resistors R3$p$ and R3$n$. Instead, it is also conceivable to connect a resistor of the magnitude 2*R3$p$=2*R3$n$ between the inputs of the waveguides Tp and Tn.

As already mentioned, the output voltage Vout at the output A is proportional to the difference between the input voltages, that is to say, proportional to Vinp−Vinn. If the threshold frequencies of the poles and zeros of the compensation network or respectively of the compensation networks are selected correctly, the amplification Vout/(Vinp−Vinn) is at least approximately frequency-independent. If the waveguides are terminated correctly across the entire frequency range, no interference in the waviness occurs in the frequency response. The input resistance of the circuit with direct voltage corresponds to the sum of the resistance values of R1$p$+R2$p$+R3$p$=R1$n$+R2$n$+R3$n$. The input resistance is therefore very high.

The invention is not restricted to the exemplary embodiments presented. For example, the compensation network can also be subdivided, wherein a first part of the compensation network is disposed respectively in the feedback path and another part of the compensation network is arranged at the load end of the amplifier.

The invention claimed is:

1. A probe system for measuring a differential input signal, comprising:
    a first input network, which is supplied with a first component of the differential input signal in order to generate a first intermediate signal;
    a second input network, which is supplied with a second component of the differential input signal in order to generate a second intermediate signal, wherein the first input network and second input network each comprise a series circuit of a first resistor and a second resistor and a first capacitor, which is connected in parallel to the second resistor;
    a differential amplifier arranged downstream of the first and second input networks in the signal-flow direction for the amplification of the difference between the intermediate signals, wherein the differential amplifier includes an input end having first and second inputs and an output end having first and second outputs; and
    at least one compensation network arranged at the output end of the differential amplifier and configured to compensate for the influence of the input networks on the components of the differential input signal, wherein the at least one compensation network comprises a series connection of a fourth resistor and a fifth resistor connected to at least one of the first and second outputs of the differential amplifier, and a second capacitor, which is connected in parallel to the fifth resistor;
    wherein the at least one compensation network is either arranged between the first output and the second output of the differential amplifier or includes a first compensation network arranged exclusively between the first output of the differential amplifier and the circuit ground and/or a second compensation network arranged exclusively between the second output of the differential amplifier and the circuit ground,
    wherein each input network provides respectively a first zero and a first pole in its transmission function and wherein the at least one compensation network provides respectively a second zero and a second pole in its transmission function, and wherein the second zero of the least one compensation network compensates the first pole of at least one input network, and the second pole of the at least one compensation network compensates the first zero of at least one input network, and
    wherein the output end of the differential amplifier is directly supplied to the output of the probe system.

2. The probe system according to claim 1, further comprising
    a first transmission line configured to transmit the first component of the differential input signal and connected in the signal flow direction between the output of the first input network and the first input of the differential amplifier and/or
    a second transmission line configured to transmit the second component of the differential input signal and connected in the signal flow direction between the output of the second input network and a second input of the differential amplifier.

3. The probe system according to claim 2, further comprising
    a third resistor, which terminates the respective transmission line with a matching terminal resistance value, is arranged between each transmission line and an associated input of the differential amplifier.

4. The probe system according to claim 1, wherein at least one output of the differential amplifier is configured to output an output signal proportional to the difference between two input signals.

5. The probe system according to claim 1, wherein the differential amplifier provides a non-inverting output and an inverting output.

6. A probe system for measuring a differential input signal, comprising:

a first input network, which is supplied with a first component of the differential input signal in order to generate a first intermediate signal;

a second input network, which is supplied with a second component of the differential input signal in order to generate a second intermediate signal, wherein the first input network and second input network each comprise a series circuit of a first resistor and a second resistor and a first capacitor, which is connected in parallel to the second resistor;

a differential amplifier arranged downstream of the first and second input networks in the signal-flow direction for the amplification of the difference between the intermediate signals, wherein the differential amplifier includes an input end having first and second inputs and an output end having first and second outputs; and at least one compensation network arranged at the output end of the differential amplifier and configured to compensate for the influence of the input networks on the components of the differential input signal, wherein the at least one compensation network comprises a series connection of a fourth resistor and a fifth resistor connected to one of the first and second outputs of the differential amplifier, and a second capacitor, which is connected in parallel to the fifth resistor;

wherein the at least one compensation network comprises one of:

a first compensation network arranged exclusively between the first output of the differential amplifier and the circuit ground, and a second compensation network arranged exclusively between the second output of the differential amplifier and the circuit ground, wherein each input network provides respectively a first zero and a first pole in its transmission function and wherein the at least one compensation network provides respectively a second zero and a second pole in its transmission function, and wherein the second zero of the at least one compensation network compensates the first pole of at least one input network, and the second pole of the at least one compensation network compensates the first zero of at least one input network, and wherein the output end of the differential amplifier is directly supplied to the output of the probe system.

\* \* \* \* \*